(12) United States Patent
Choi et al.

(10) Patent No.: US 8,509,002 B2
(45) Date of Patent: Aug. 13, 2013

(54) SEMICONDUCTOR MEMORY DEVICE AND METHOD OF DRIVING THE SAME

(75) Inventors: Jong Hyun Choi, Suwon-si (KR); Jin Seok Kwak, Hwasung-si (KR); Seong Jin Jang, Seongnam-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 437 days.

(21) Appl. No.: 12/789,532

(22) Filed: May 28, 2010

(65) Prior Publication Data
US 2010/0302892 A1    Dec. 2, 2010

(30) Foreign Application Priority Data

May 29, 2009    (KR) .................. 10-2009-0047273
Jun. 12, 2009    (KR) .................. 10-2009-0052450

(51) Int. Cl.
*G11C 11/34* (2006.01)
(52) U.S. Cl.
USPC ...... 365/185.21; 365/205; 365/196; 365/207; 365/226

(58) Field of Classification Search
USPC ............ 365/205, 185.21, 196, 207, 226
See application file for complete search history.

(56) References Cited

U.S. PATENT DOCUMENTS

| 5,420,823 | A | * | 5/1995 | Yonaga et al. ............... 365/226 |
| 7,221,606 | B2 | | 5/2007 | Kang et al. |
| 2005/0213387 | A1 | | 9/2005 | Kubo et al. |
| 2007/0201290 | A1 | | 8/2007 | Kang |

FOREIGN PATENT DOCUMENTS

| JP | 06-084378 | 3/1994 |
| JP | 2005-285197 | 10/2005 |
| JP | 2007-226954 | 9/2007 |
| KR | 2001-0083482 | 9/2001 |
| KR | 2006-0075610 | 7/2006 |
| KR | 2007-0084785 | 8/2007 |
| KR | 10-0771547 | 10/2007 |

* cited by examiner

*Primary Examiner* — Jason Lappas
(74) *Attorney, Agent, or Firm* — Muir Patent Consulting, PLLC

(57) ABSTRACT

A semiconductor memory device is provided. The semiconductor memory device supplies to a sense amplifier a first voltage and a second voltage during data sensing, so that data sensing margin and a data sensing speed increase.

17 Claims, 12 Drawing Sheets

1

SEMICONDUCTOR MEMORY DEVICE AND METHOD OF DRIVING THE SAME

CROSS-REFERENCE TO RELATED APPLICATIONS

This application claims priority under 35 U.S.C. §119 to Korean Patent Application No. 10-2009-0047273 filed on May 29, 2009 and No. 10-2009-0052450 filed on Jun. 12, 2009, in the Korean Intellectual Property Office, the disclosures of which are incorporated herein in their entirety by reference.

BACKGROUND

The disclosed embodiments relate to a semiconductor memory device, and more particularly, to a semiconductor memory device for increasing the dynamic performance of a sense amplifier sensing data stored in a memory cell array, and a method of driving the same.

Semiconductor memory devices usually include a bit line sense amplifier (hereinafter, referred to as a sense amplifier) which receives a charge stored in a memory cell through a bit line and a complementary bit line and amplifies a voltage difference between the bit line and the complementary bit line based on the received charge to sense data stored in the memory cell. With the miniaturization of semiconductor fabrication techniques, it is important to secure an optimal sensing margin of a sense amplifier in order to decrease an operating voltage of a semiconductor memory device and reduce operating current. When an external voltage applied to the semiconductor memory device decreases according to the miniaturization of semiconductor fabrication technique and system requirements, an operating voltage of a memory core array decreases, and as a result, an input voltage of the sense amplifier diminishes due to the reduction of the voltage difference between the bit line and the complementary bit line.

A sense amplifier includes a plurality of transistors. To secure the sensing margin of the sense amplifier, the threshold voltage of the transistors included in the sense amplifier may be decreased. However, when the threshold voltages of the transistors included in the sense amplifier are decreased, sensing errors and the increase of current consumption may occur due to leakage current of the transistors.

SUMMARY

Some embodiments disclosed herein provide a semiconductor memory device for securing a sensing margin of a sense amplifier and increasing an operating speed even during low-voltage operation by improving the sensing operation of the sense amplifier, without decreasing the threshold voltage of a transistor included in the sense amplifier, and a method of driving the same.

According to some embodiments of the present invention, there is provided a semiconductor memory device including a sense amplifier and a voltage supply circuit. The sense amplifier may include a pair of N-type metal-oxide semiconductor (NMOS) transistors cross-coupled between a bit line and a complementary bit line. The voltage supply circuit may supply at least one source voltage lower than a target source voltage to a common source of the pair of NMOS transistors and then to supply the target source voltage to the common source during data sensing.

The voltage supply circuit may include a voltage generation circuit and a switch circuit. The voltage generation circuit may generate the target source voltage and the at least one source voltage. The switch circuit may supply the at least one source voltage and the target source voltage to the common source of the pair of NMOS transistors.

According to other embodiments of the present invention, there is provided a semiconductor memory device including a sense amplifier including a pair of P-type metal-oxide semiconductor (PMOS) transistors cross-coupled between a bit line and a complementary bit line and a voltage supply circuit configured to supply at least one source voltage higher than a target source voltage to a common source of the pair of PMOS transistors and then to supply the target source voltage to the common source during data sensing. The voltage supply circuit may include a voltage generation circuit configured to generate the target source voltage and the at least one source voltage and a switch circuit configured to supply the at least one source voltage and the target source voltage to the common source of the pair of PMOS transistors.

According to further embodiments of the present invention, there is provided a semiconductor memory device including a first sense amplifier, a second sense amplifier, and a voltage supply circuit. The first sense amplifier may include a pair of NMOS transistors cross-coupled between a bit line and a complementary bit line. The second sense amplifier may include a pair of PMOS transistors cross-coupled between the bit line and the complementary bit line. During data sensing, the voltage supply circuit may sequentially supply at least one first source voltage lower than a first target source voltage from a lowest to a highest voltage to a common source of the pair of NMOS transistors and then supply the first target source voltage to the common source and sequentially supply at least one second source voltage higher than a second target source voltage from a highest to a lowest voltage to a common source of the pair of PMOS transistors and then supply the second target source voltage to the common source.

The voltage supply circuit may include a voltage generation circuit and a switch circuit. The voltage generation circuit may generate the first target source voltage, the second target source voltage, the at least one first source voltage, and the at least one second source voltage. The switch circuit may sequentially supply the at least one first source voltage and the first target source voltage from the lowest to the highest voltage to the common source of the pair of NMOS transistors and sequentially supply the at least one second source voltage and the second target source voltage from the highest to the lowest voltage to the common source of the pair of PMOS transistors.

In other embodiments of the present invention, a semiconductor memory device includes a main sense amplifier, an auxiliary sense amplifier, and a voltage supply circuit. The main sense amplifier may include a pair of NMOS transistors which are cross-coupled between a bit line and a complementary bit line and which perform data sensing based on a target source voltage supplied to their common source. The auxiliary sense amplifier may include a pair of NMOS transistors which are connected between the bit line and the complementary bit line, which have a smaller size than the pair of NMOS transistors comprised in the main sense amplifier, and which perform data sensing based on a source voltage lower than the target source voltage. The voltage supply circuit may supply the source voltage to the auxiliary sense amplifier and then supply the target source voltage to a common source of the pair of NMOS transistors of the main sense amplifier during data sensing.

The voltage supply circuit may include a voltage generation circuit configured to generate the target source voltage and the source voltage and a switch circuit configured to supply the source voltage to a source of one of the NMOS transistors_of the auxiliary sense amplifier and then to supply the target source voltage to the common source of the NMOS transistors of the main sense amplifier.

In yet other embodiments of the present invention, a semiconductor memory device includes a main sense amplifier comprising a pair of PMOS transistors which are cross-coupled between a bit line and a complementary bit line and perform data sensing based on a target source voltage supplied to their common source; an auxiliary sense amplifier comprising a pair of PMOS transistors which are connected between the bit line and the complementary bit line, have a smaller size than the pair of PMOS transistors comprised in the main sense amplifier, and perform data sensing based on a source voltage higher than the target source voltage; and a voltage supply circuit configured to supply the source voltage to the auxiliary sense amplifier and then to supply the target source voltage to a common source of the pair of PMOS transistors of the main sense amplifier during data sensing.

The voltage supply circuit may include a voltage generation circuit configured to generate the target source voltage and the source voltage and a switch circuit configured to supply the source voltage to a source of one of the PMOS transistors of the auxiliary sense amplifier and then to supply the target source voltage to the common source of the PMOS transistors of the main sense amplifier.

In yet other embodiments of the present invention, a method of driving a semiconductor memory device, the method comprises initiating supplying a first voltage to a sense amplifier at a first time; discontinuing supplying the first voltage to the sense amplifier at a second time; initiating supplying a second voltage, having a different voltage level from the first voltage, to the sense amplifier after the first time; continuing supplying the second voltage to the sense amplifier after the second time; and performing a data sensing operation on data by the sense amplifier for a period including the first time and the second time, using both the first voltage and the second voltage.

The first voltage is higher than the second voltage or lower than the second voltage according to types of transistors included the amplifier.

BRIEF DESCRIPTION OF THE DRAWINGS

The above and other features and advantages disclosed herein will become more apparent by describing in detail exemplary embodiments thereof with reference to the attached drawings in which.

DETAILED DESCRIPTION

Figure 1:
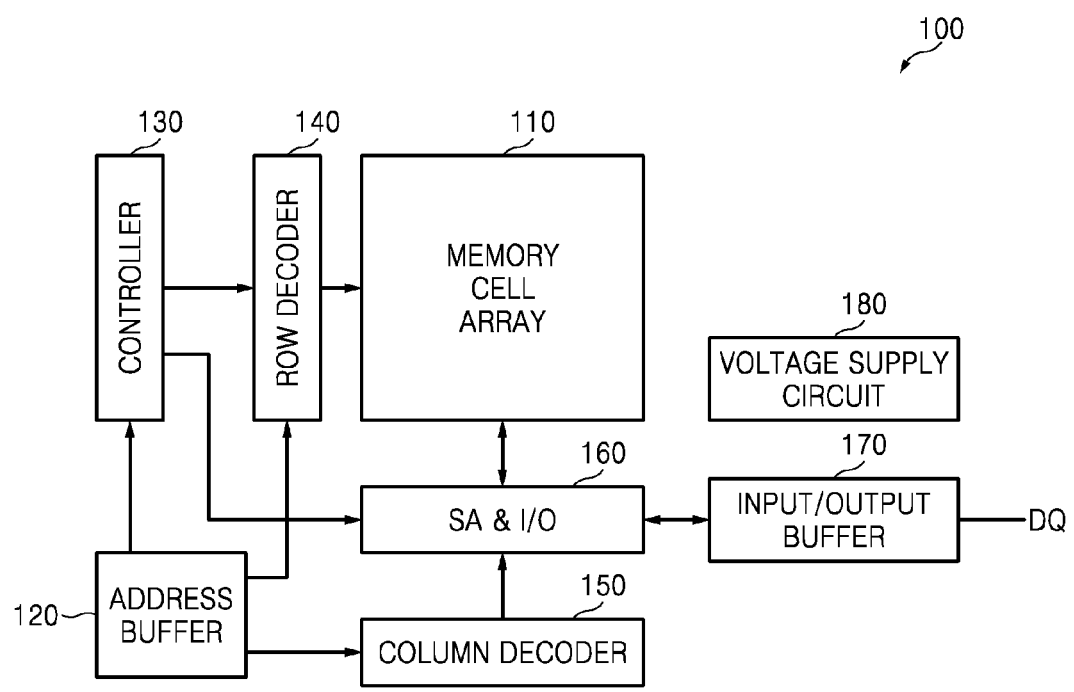
FIG. 1 is an exemplary block diagram of a semiconductor memory device, according to some embodiments.

This application will now be described more fully hereinafter with reference to the accompanying drawings, in which various disclosed embodiments are shown. This invention may, however, be embodied in many different forms and should not be construed as limited to the embodiments set forth herein. In the drawings, the size and relative sizes of circuit elements may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to limit the scope of the disclosed embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is an exemplary block diagram of a semiconductor memory device 100, according to some embodiments. The semiconductor memory device 100 includes a memory cell array 110, an address buffer 120, a controller 130, a row decoder 140, a column decoder 150, a sense amplifier (SA) and input/output (I/O) circuit 160, an input/output buffer 170, and a voltage supply circuit 180.

The memory cell array 110 includes a plurality of memory cells (not shown) each storing data, and a plurality of word lines (not shown), bit lines (not shown), and complementary bit lines (not shown) connected to the plurality of memory cells. The address buffer 120 buffers an address signal input thereto and transmits the address signal to the controller 130, the row decoder 140, and the column decoder 150.

The controller 130 receives an address signal and controls the row decoder 140, the column decoder 150, and the SA and I/O circuit 160 based on a write, a read, or an erase command. The row decoder 140 selects a word line connected to memory cells, which data is input to or output from, in response to an address signal and a command received from the controller 130. The column decoder 150 selects a bit line and a complementary bit line connected to memory cells, which data is input to or output from, in response to an address signal and a command received from the controller 130.

The SA and I/O circuit 160 inputs data to or outputs data from memory cells through a bit line and a complementary bit line. The input/output buffer 170 buffers data input or output through the SA and I/O circuit 160. The voltage supply circuit 180 generates a plurality of voltages and supplies an appropriate voltage to each element of the semiconductor memory device 100. For instance, the voltage supply circuit 180 generates a variety of internal voltages such as a plate voltage, an internal boosted voltage, an internal low voltage, a precharge voltage, and a substrate back bias voltage based on an operating voltage supplied from a power supply terminal.

Since the present disclosure aims at improving the operating characteristics of the SA and I/O circuit 160, the operations of an SA and I/O circuit and a voltage supply circuit provided for a dynamic random access memory (DRAM) device, which is a representative non-volatile memory device, will be described. However, the scope of the present invention is not restricted thereto and the technical ideas disclosed herein can be applied to any type of semiconductor memory devices that include a sense amplifier using a transistor.

Figure 2:
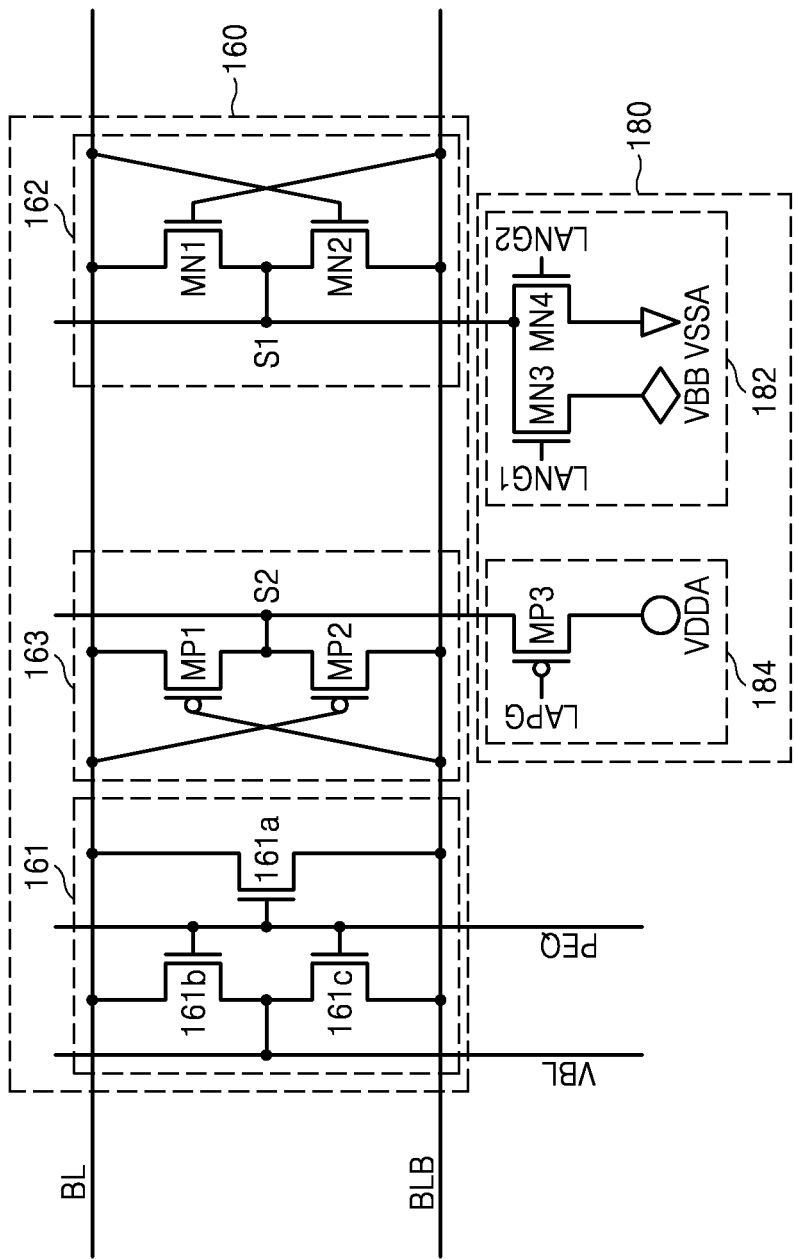
FIG. 2 is an exemplary circuit diagram of a sense amplifier (SA) and input/output (I/O) circuit and a voltage supply circuit included in the semiconductor memory device illustrated in FIG. 1, according to some embodiments.

FIG. 2 is an exemplary circuit diagram of the SA and I/O circuit 160 and the voltage supply circuit 180 included in the semiconductor memory device 100 illustrated in FIG. 1, according to some embodiments. Referring to FIG. 2, the SA and I/O circuit 160 includes a precharge circuit 161, a first sense amplifier 162, and a second sense amplifier 163. The voltage supply circuit 180 includes a switch circuit.

The precharge circuit 161 precharges a bit line BL and a complementary bit line BLB with a precharge voltage VBL using a plurality of transistors 161a, 161b, and 161c switched in response to a precharge signal PEQ. In one embodiment, the precharge voltage VBL may be, for example, half of VDDA (e.g., between 0.4 V and 0.6 V). The first sense amplifier 162 and the second sense amplifier 163 amplify a voltage difference between the bit line BL and the complementary bit line BLB and sense data stored in a memory cell.

The first sense amplifier 162 includes a pair of N-type metal-oxide semiconductor (NMOS) transistors MN1 and MN2 cross-coupled between the bit line BL and the complementary bit line BLB. The second sense amplifier 163 includes a pair of P-type metal-oxide semiconductor (PMOS) transistors MP1 and MP2 cross-coupled between the bit line BL and the complementary bit line BLB. Here, being "cross-coupled" means that gates of a pair of transistors connected between the bit line BL and the complementary bit line BLB are cross connected to the bit line BL and the complementary bit line BLB, respectively, and a voltage is applied to a common source of the transistor pair.

In sensing data, the first sense amplifier 162 performs data sensing based on a source voltage VBB lower than a target source voltage VSSA and then performs data sensing based on the target source voltage VSSA. For example, in one embodiment, a target source voltage VSSA could be approximately 0 V, and VBB could be approximately between −0.5 V and −0.2 V, such that VBB is approximately 0.2 V to 0.5 V lower than VSSA. Through such operation of the first sense amplifier 162, the sensing margin of the first sense amplifier 162 increases (e.g., when VBB is used, the voltage difference between BL and BLB after a particular period of time is greater than the voltage difference after the same period of time if VSSA is used).

When the data sensing starts, the source voltage VBB lower than the target source voltage VSSA is applied to a common source S1 of the pair of the NMOS transistors MN1 and MN2 and a gate-source voltage (e.g., difference between the voltage at the gate and the source of the transistor) of the pair of the NMOS transistors MN1 and MN2 becomes higher than that when the target source voltage VSSA is applied. Due to this high gate-source voltage of the pair of the NMOS transistors MN1 and MN2, the sensing margin of the first sense amplifier 162 increases. As a result, the high gate-source voltage of the pair of the NMOS transistors MN1 and MN2 also increases the operating speed of the first sense amplifier 162 (i.e., decreases the amount of time necessary to for the sense amplifier to sense data).

The voltage supply circuit 180 supplies the source voltage VBB lower than the target source voltage VSSA to the common source S1 of the pair of the NMOS transistors MN1 and MN2 included in the first sense amplifier 162 and then supplies the target source voltage VSSA to the common source S1. Although not shown in FIG. 2, the voltage supply circuit 180 may also include a capacitor to stably supply the source voltage VBB to the common source S1 of the pair of the NMOS transistors MN1 and MN2.

The target source voltage VSSA is supplied to the common source S1 of the first sense amplifier 162 after the source voltage VBB is supplied thereto in the embodiments illustrated in FIG. 2, but the scope of the present disclosure is not restricted to those embodiments. For instance, before the target source voltage VSSA is supplied to the common source S1 of the first sense amplifier 162, at least two source voltages lower than the target source voltage VSSA may be supplied to the common source S1 sequentially from the lowest to the highest voltage.

The voltage supply circuit 180 is additionally configured to supply a target source voltage VDDA to a common source S2 of the pair of the PMOS transistors MP1 and MP2 included in the second sense amplifier 163.

The voltage supply circuit 180 may include a power generation circuit (not shown) and a switch circuit. The voltage supply circuit 180 generates the target source voltages VSSA and VDDA and the source voltage VBB. The switch circuit sequentially supplies the source voltage VBB and the target source voltage VSSA to the common source S1 of the pair of the NMOS transistors MN1 and MN2 included in the first sense amplifier 162 or supplies the target source voltage VDDA to the common source S2 of the pair of the PMOS transistors MP1 and MP2.

The switch circuit includes a first switch circuit 182 and a second switch circuit 184. The first switch circuit 182 includes a switch MN3 for supplying the source voltage VBB to the first sense amplifier 162 in response to a first voltage supply signal LANG1 and a switch MN4 for supplying the target source voltage VSSA to the first sense amplifier 162 in response to a second voltage supply signal LANG2. The second switch circuit 184 includes a switch MP3 for supplying the target source voltage VDDA to the second sense amplifier 163 in response to a third voltage supply signal LAPG.

Figure 3:
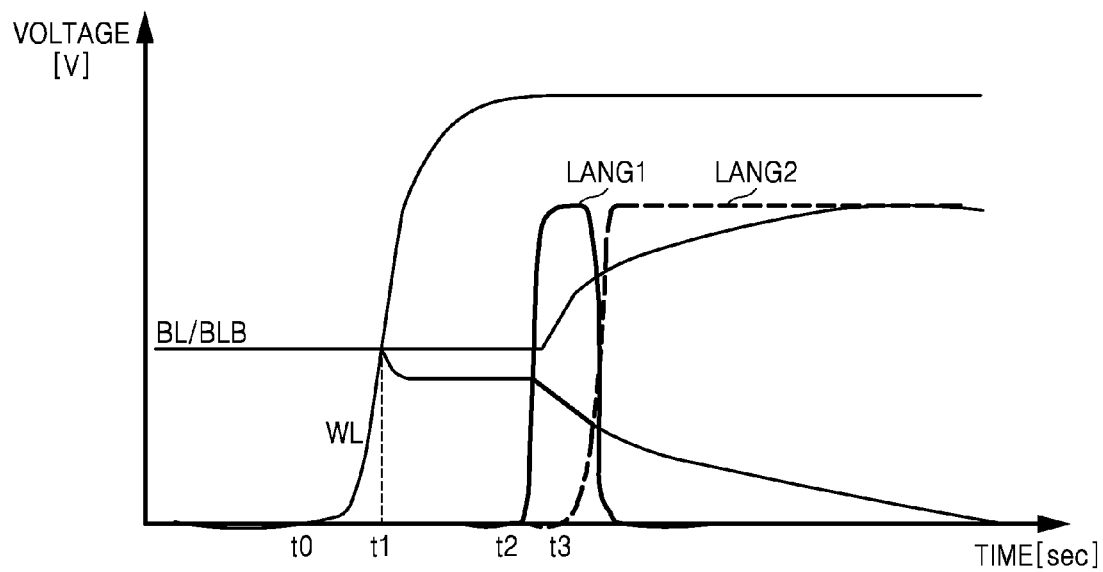
FIG. 3 is an exemplary timing chart for explaining the operations of the SA and I/O circuit and the voltage supply circuit illustrated in FIG. 2, according to some embodiments.

FIG. 3 is an exemplary timing chart for explaining the operations of the SA and I/O circuit 160 and the voltage supply circuit 180 illustrated in FIG. 2. The operations of the SA and I/O circuit 160 and the voltage supply circuit 180 will be described based on voltages supplied to the first sense amplifier 162 with reference to FIGS. 2 and 3.

The precharged state of the bit line BL and the complementary bit line BLB is maintained until a time point t0. From a time point t1 (e.g., a predetermined period of time after the time point t0 at which a word line selection signal WL is enabled), charges stored in a pair of memory cells are output, and therefore, a voltage difference occurs between the bit line BL and the complementary bit line BLB.

From a time point t2 when the switch MN3 for supplying the source voltage VBB to the first sense amplifier 162 is short-circuited in response to the first voltage supply signal LANG1, a differential between the bit line BL and the complementary bit line BLB start to be developed. From a time point t3 (e.g., a predetermined period time after the switch MN3 for supplying the source voltage VBB to the first sense amplifier 162 is short-circuited), the switch MN4 for supplying the target source voltage VSSA to the first sense amplifier 162 is short-circuited in response to the second voltage supply signal LANG2, the switch MN3 is turned off in response to LANG1, and the differential between the bit line BL and the complementary bit line BLB are completely developed.

According to the above-described operations, a sensing operation is performed first for a predetermined, temporary period of time, based on the source voltage VBB lower than the target source voltage VSSA, and then subsequently based on the target source voltage VSSA, so that the sensing margin and the sensing speed of the first sense amplifier 162 can be increased.

In the embodiments described above, the semiconductor memory device 100 drives the first sense amplifier 162 first with the source voltage VBB lower than the target source voltage VSSA and then with the target source voltage VSSA, thereby increasing a data sensing margin and a data sensing speed. Alternatively, at least two source voltages lower than the target source voltage VSSA may be sequentially applied to the first sense amplifier 162 from the lowest to the highest voltage before the target source voltage VSSA is applied to the first sense amplifier 162.

According to other embodiments, the semiconductor memory device 100 may drive the second sense amplifier 163 first with a source voltage VDDA' higher than the target source voltage VDDA and then with the target source voltage VDDA, thereby increasing a sensing margin and increasing a sensing speed. For example, in one embodiment, VDDA could be between 0.8 V and 1.2 V, and VDDA' could be slightly higher than VDDA' (e.g., between 0.2 V and 1 V higher than VDDA). This operation will be described with reference to FIGS. 4 and 5. Alternatively, at least two source voltages higher than the target source voltage VDDA may be sequentially applied to the second sense amplifier 163 from the highest to the lowest voltage before the target source voltage VDDA is applied to the second sense amplifier 163.

Figure 4:
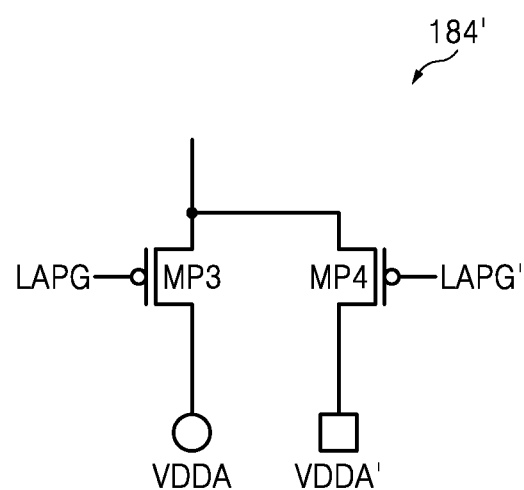
FIG. 4 is an exemplary circuit diagram of a part of a voltage supply circuit corresponding to an SA including a pair of P-type metal-oxide semiconductor (PMOS) transistors, according to some embodiments.

FIG. 4 is an exemplary circuit diagram of a part of a voltage supply circuit 184', which corresponds to the second sense amplifier 163 including the pair of the PMOS transistors MP1 and MP2 according to certain disclosed embodiments. The voltage supply circuit 184' is provided to supply the source voltage VDDA' higher than the target source voltage VDDA to the common source S2 of the pair of the PMOS transistors MP1 and MP2 included in the second sense amplifier 163 and then supply the target source voltage VDDA to the common source S2 during data sensing. The operation of the voltage supply circuit 184' will be described with reference to FIGS. 2 and 4.

The voltage supply circuit 184' may include a voltage generator (not shown) generating the target source voltage VDDA and the source voltage VDDA'. The voltage supply circuit 184' includes a switch circuit including switches MP3 and MP4 to supply the source voltage VDDA' to the common source S2 of the pair of the PMOS transistors MP1 and MP2 and then supply the target source voltage VDDA to the common source S2.

In sensing data, the second sense amplifier 163 performs data sensing based on the source voltage VDDA' higher than the target source voltage VDDA and then performs data sensing based on the target source voltage VDDA. Through this operation of the second sense amplifier 163, the sensing margin of the second sense amplifier 163 increases.

When the data sensing starts, the source voltage VDDA' higher than the target source voltage VDDA is applied to the common source S2 of the pair of the PMOS transistors MP1 and MP2 and a gate-source voltage of the pair of the PMOS transistors MP1 and MP2 becomes higher than that when the target source voltage VDDA is applied. Due to this high gate-source voltage of the pair of the PMOS transistors MP1 and MP2, the sensing margin of the second sense amplifier 163 increases. Furthermore, the high gate-source voltage of the pair of the PMOS transistors MP1 and MP2 also increases the operating speed of the second sense amplifier 163.

Although not shown in FIG. 4, the voltage supply circuit 184' may also include a capacitor connected between a source voltage line and a ground voltage line to stably supply the source voltage VDDA' to the common source S2 of the pair of the PMOS transistors MP1 and MP2.

The target source voltage VDDA is supplied to the common source S2 of the second sense amplifier 163 after the source voltage VDDA' is supplied thereto in the embodiments illustrated in FIG. 4, but the scope of the disclosed embodiments is not restricted as such. For instance, before the target source voltage VDDA is supplied to the common source S2 of the second sense amplifier 163, at least two source voltages higher than the target source voltage VDDA may be supplied to the common source S2 sequentially from the highest to the lowest voltage.

Figure 5:
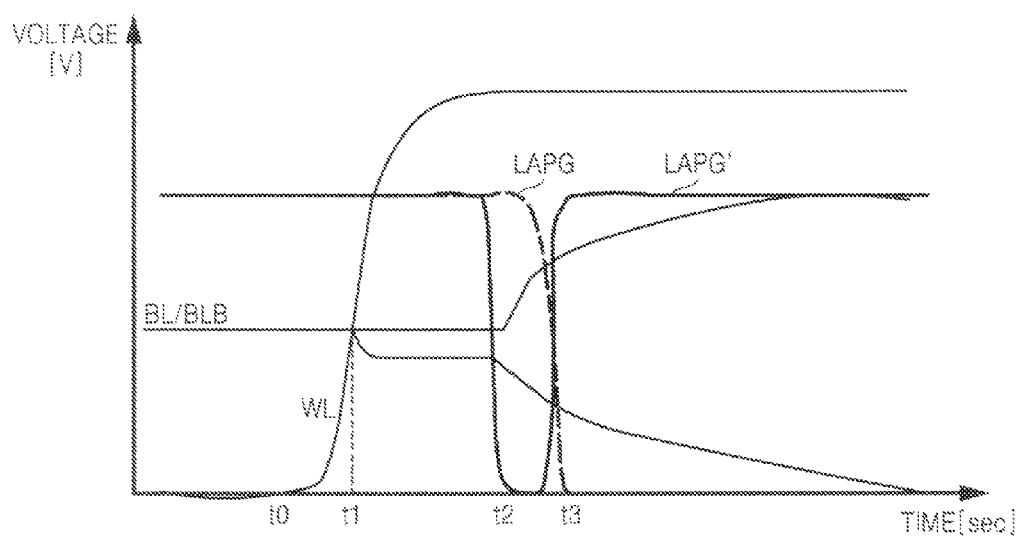
FIG. 5 is an exemplary timing chart for explaining the operations of the voltage supply circuit illustrated in FIG. 4 and the SA including the pair of PMOS transistors, according to some embodiments.

FIG. 5 is an exemplary timing chart for explaining the operations of the voltage supply circuit 184' illustrated in FIG. 4 and the second sense amplifier 163 including the pair of the PMOS transistors MP1 and MP2. The operations of the SA and I/O circuit 160 and the voltage supply circuit 184' will be described based on voltages supplied to the second sense amplifier 163 with reference to FIGS. 2, 4 and 5.

The precharged state of the bit line BL and the complementary bit line BLB is maintained until a time point t0. From a time point t1 (e.g., a predetermined period of time after the time point t0 at which a word line selection signal WL is enabled), charges stored in a pair of memory cells are output, and therefore, a voltage difference occurs between the bit line BL and the complementary bit line BLB.

From a time point t2 when the switch MP4 for supplying the source voltage VDDA' to the second sense amplifier 163 is short-circuited in response to a fourth voltage supply signal LAPG', the differential between the bit line BL and the complementary bit line BLB start to be developed. From a time point t3 (e.g., a predetermined period time after the switch MP4 for supplying the source voltage VDDA' to the second sense amplifier 163 is short-circuited), the switch MP3 for supplying the target source voltage VDDA to the second sense amplifier 163 is short-circuited in response to the third voltage supply signal LAPG, the switch MP4 is turned off in response to the fourth voltage supply signal LAPG', and the differential between the bit line BL and the complementary bit line BLB are completely developed.

According to the above-described operations, a sensing operation is performed first for a predetermined, temporary period of time, based on the source voltage VDDA' higher than the target source voltage VDDA, and then subsequently based on the target source voltage VDDA, so that the sensing margin and the sensing speed of the second sense amplifier 163 can be increased.

Figure 6:
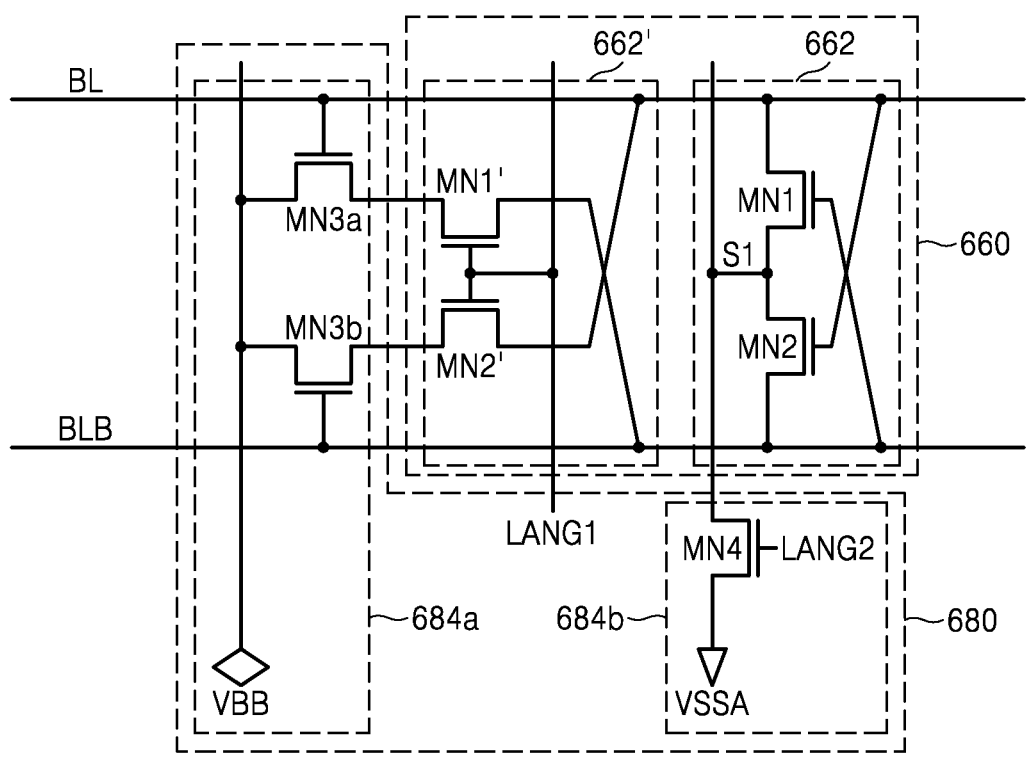
FIG. 6 is an exemplary circuit diagram of an SA and I/O circuit and a voltage supply circuit included in a semiconductor memory device, according to other embodiments.

FIG. 6 is a circuit diagram of an SA and I/O circuit 660 and a voltage supply circuit 680 included in a semiconductor memory device such as device 100 illustrated in FIG. 1, according to other embodiments. In one embodiment, SA and I/O circuit 660 and voltage supply circuit 680 are used as alternatives to corresponding circuitry in SA and I/O circuit 160 and voltage supply circuit 180 in FIG. 2. Referring to FIG. 6, the SA and I/O circuit 660 includes a main sense amplifier 662 and an auxiliary sense amplifier 662' and the voltage supply circuit 680 includes a switch circuit including a first switch circuit 684a and a second switch circuit 684b to provide voltages to the main sense amplifier 662 and the auxiliary sense amplifier 662'.

The main sense amplifier 662 includes a pair of the NMOS transistors MN1 and MN2 performing data sensing based on the target source voltage VSSA supplied to the common source S1. The auxiliary sense amplifier 662' includes a pair of NMOS transistors MN1' and MN2' connected between the bit line BL and the complementary bit line BLB and performing data sensing based on the source voltage VBB lower than the target source voltage VSSA. The size of the NMOS transistors MN1' and MN2' of the auxiliary sense amplifier 662' may be smaller than that of the NMOS transistors MN1 and MN2 of the main sense amplifier 662 in order to reduce data sensing loading based on the source voltage VBB, and increase an operating speed.

During data sensing, the voltage supply circuit 680 supplies the source voltage VBB to the auxiliary sense amplifier 662' and then supplies the target source voltage VSSA to the common source S1 of the pair of the NMOS transistors MN1 and MN2 included in the main sense amplifier 662. The voltage supply circuit 680 may include a voltage generation circuit (not shown) generating the target source voltage VSSA and the source voltage VBB. The switch circuit (684a and 684b) may also supply the source voltage VBB to a source of either of the NMOS transistors MN1' and MN2' of the auxiliary sense amplifier 662' and then supply the target source voltage VSSA to the common source S1 of the NMOS transistors MN1 and MN2 of the main sense amplifier 662.

The operations of the SA and I/O circuit 660 will be sequentially described based on voltages supplied to the main sense amplifier 662 and the auxiliary sense amplifier 662'.

One of switches MN3a and MN3b included in the first switch circuit 684a is short-circuited based on voltages of the bit line BL and the complementary bit line BLB, and therefore, the source voltage VBB is supplied to the source of one of the NMOS transistors MN1' and MN2' of the auxiliary sense amplifier 662'. The NMOS transistors MN1' and MN2' of the auxiliary sense amplifier 662' are turned on in response to a first voltage supply signal LANG1. At this time, a gate-source voltage of the turned-on transistor MN1' or MN2' corresponding to the short circuited switch MN3a or MN3b is higher than that if the target source voltage VSSA had been applied to the auxiliary sense amplifier 662'. In this state, data sensing is performed. After the data sensing of the auxiliary sense amplifier 662', the main sense amplifier 662 performs data sensing based on the target source voltage VSSA. In other words, at the early stage of the data sensing, the data sensing is performed by the auxiliary sense amplifier 662' which has a large sensing margin and a fast operating speed. Thereafter, the main sense amplifier 662 performs the data sensing.

Alternatively, a main sense amplifier and an auxiliary sense amplifier may be implemented by a pair of PMOS transistors. As such, a sense amplifier such as the main sense amplifier and auxiliary sense amplifier shown in FIG. 6 may each include two PMOS transistors instead of NMOS transistors. Accordingly, the main sense amplifier and the auxiliary sense amplifier may operate data sensing based on a source voltage driven at the early stage of data sensing higher than the target source voltage VDDA, thereby increasing a data sensing margin and a data sensing speed. The main and auxiliary sense amplifiers may have a structure similar to those of the sense amplifiers 662 and 662' illustrated in FIG. 6. The auxiliary sense amplifier may include a pair of PMOS transistors which are connected between the bit line BL and the complementary bit line BLB, have a smaller size than the PMOS transistors of the main sense amplifier, and perform data sensing based on a source voltage higher than the target source voltage VDDA. Here, during the data sensing, the voltage supply circuit 680 may supply the source voltage higher than the target source voltage VDDA to the auxiliary sense amplifier and then supply the target source voltage VDDA to a common source of the PMOS transistors of the main sense amplifier. Accordingly, the voltage supply circuit 680 may include a switch circuit which supplies the source voltage to a source of either of the pair of PMOS transistors included in the auxiliary sense amplifier and then supplies the target source voltage VDDA to the common source of the PMOS transistors of the main sense amplifier.

Figure 7A:
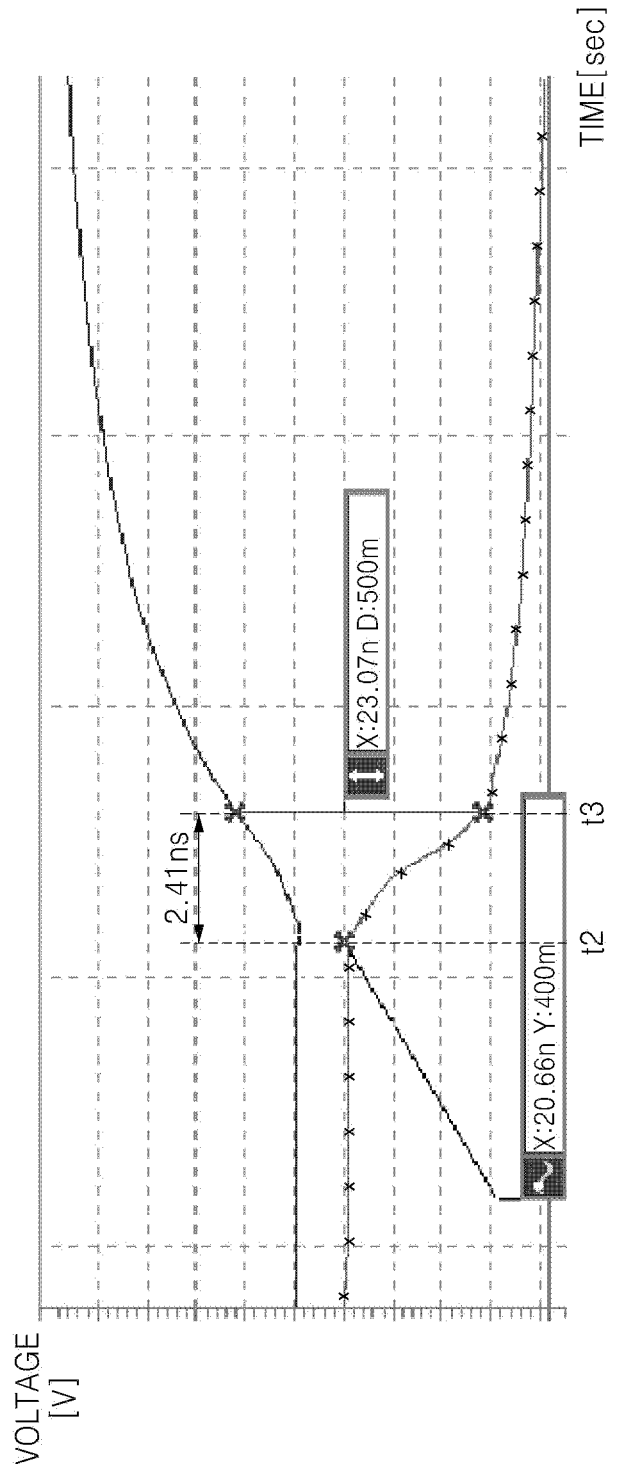
FIG. 7A is a graph showing the results of data sensing in a semiconductor memory device when a driving voltage is 1 V, according to some exemplary embodiments.
Figure 7B:
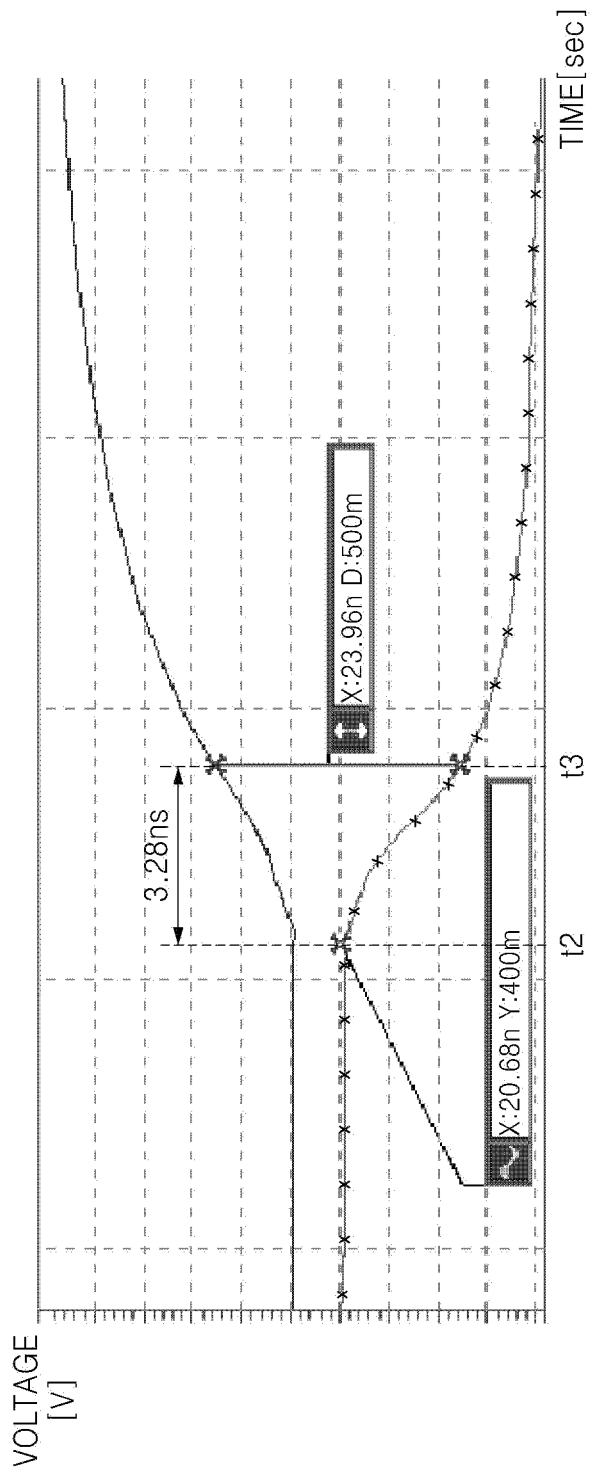
FIG. 7B is a graph showing the results of data sensing in a semiconductor memory device when a driving voltage is 1 V in a comparison example.

FIG. 7A is a graph showing the results of sensing data in a semiconductor memory device when a driving voltage (e.g., the target source voltage VDDA described above) is 1 V, according to some embodiments. FIG. 7B is a graph showing the results of sensing data in a semiconductor memory device when a driving voltage is 1 V in a comparison example.

Referring to FIG. 7A, data is sensed from the sense amplifier when the voltage difference between the bit line and a complimentary bit line reaches 500 mV. As shown in FIG. 7A, when circuits such as shown in FIGS. 2, 4, and/or 6 are used, it takes 2.41 nanoseconds (nsec) starting from when a voltage starts to be supplied to a sense amplifier until a voltage difference between a bit line and a complementary bit line reaches 500 mV. As such, it takes 2.41 nsec for data to be sensed. Referring to FIG. 7B, it takes 3.28 nsec for data to be sensed when conventional circuits are used. In other words, the semiconductor memory device according to certain disclosed embodiments has a faster data sensing speed than the conventional semiconductor memory device. In the embodiment shown in FIG. 7A, the speed is increased more than 25%.

Figure 8A:
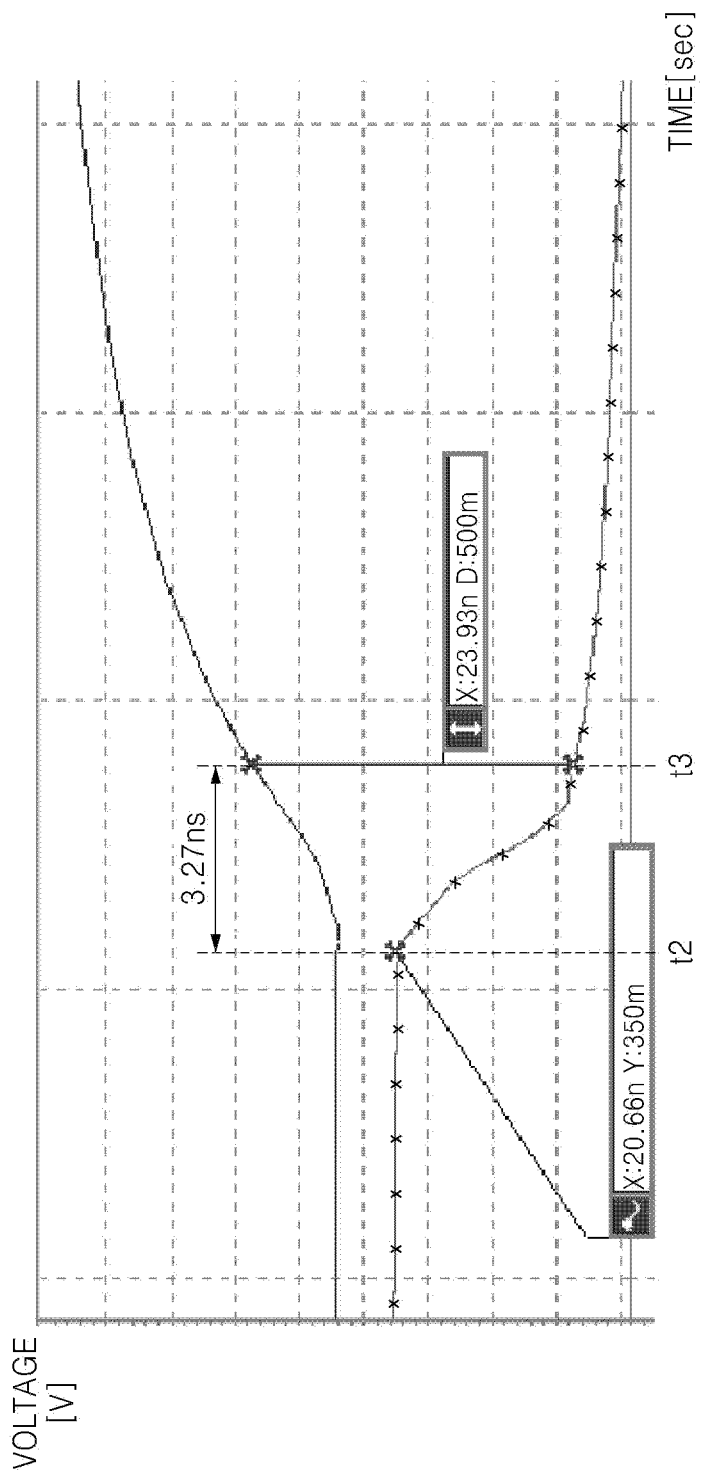
FIG. 8A is a graph showing the results of data sensing in a semiconductor memory device when a driving voltage is 0.9 V, according to some exemplary embodiments.
Figure 8B:
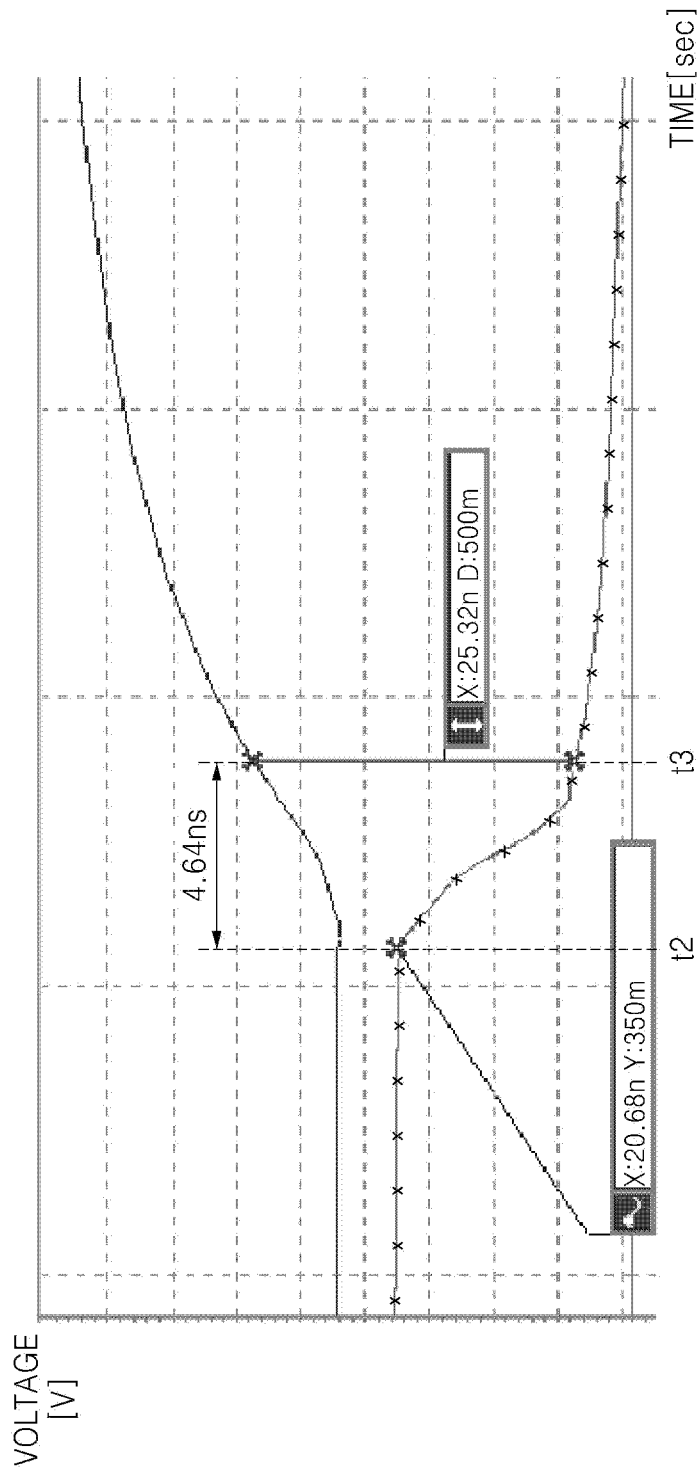
FIG. 8B is a graph showing the results of data sensing in a semiconductor memory device when a driving voltage is 0.9 V in a comparison example.

FIG. 8A is a graph showing the results of data sensing in a semiconductor memory device when a driving voltage is 0.9 V, according to some embodiments. FIG. 8B is a graph showing the results of data sensing in a semiconductor memory device when a driving voltage is 0.9 V in a comparison example.

Referring to FIG. 8A, it takes 3.27 nsec starting from when a voltage starts to be supplied to a sense amplifier until a voltage difference between a bit line and a complementary bit line reaches 500 mV. As such, it takes 3.27 nsec for data to be sensed. Referring to FIG. 8B, it takes 4.64 nsec for data to be sensed when conventional circuits are used. In other words, the semiconductor memory device according to certain disclosed embodiments has a faster data sensing speed than the conventional semiconductor memory device. In the embodiment shown in FIG. 8A, the speed is increased more than 40%.

Figure 9A:
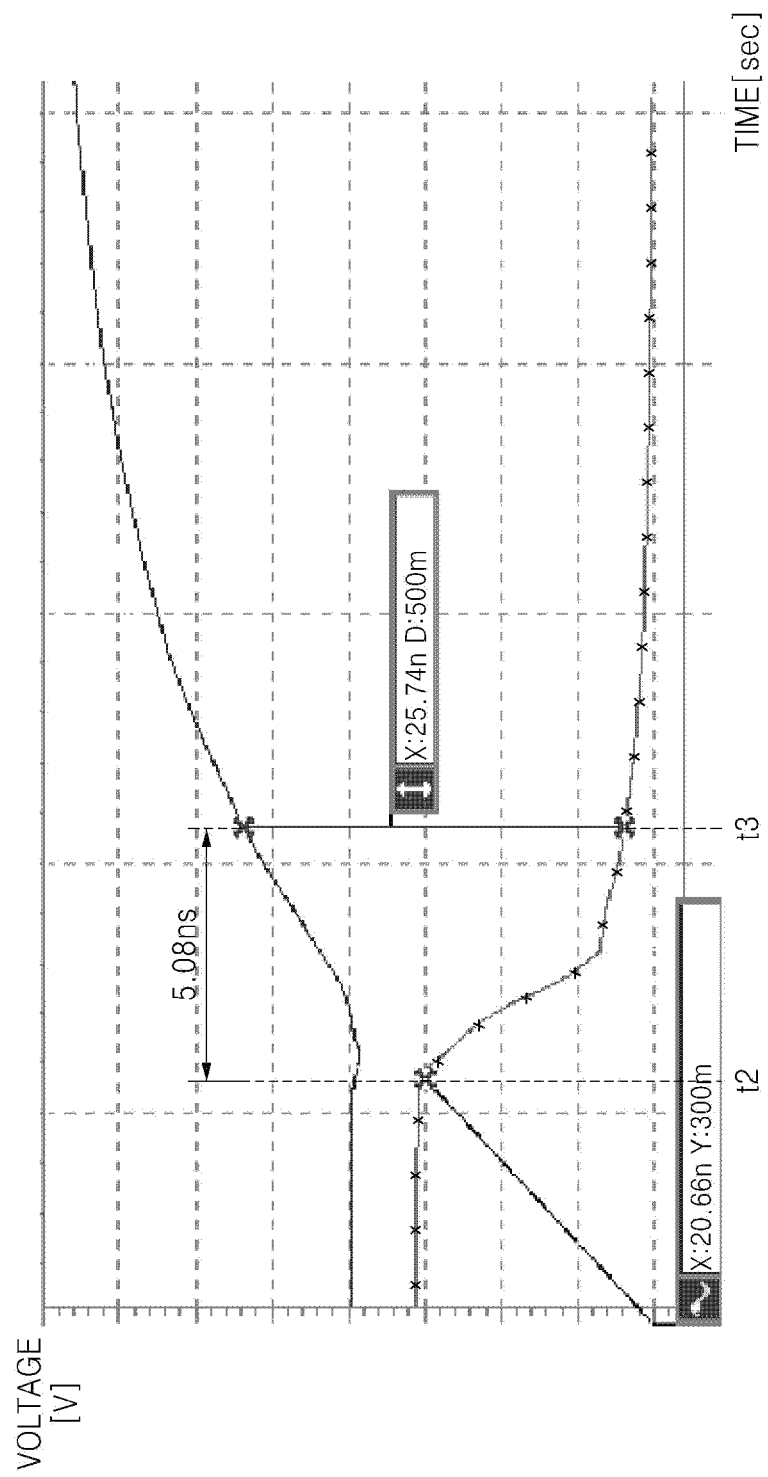
FIG. 9A is a graph showing the results of data sensing in a semiconductor memory device when a driving voltage is 0.8 V, according to some exemplary embodiments.
Figure 9B:
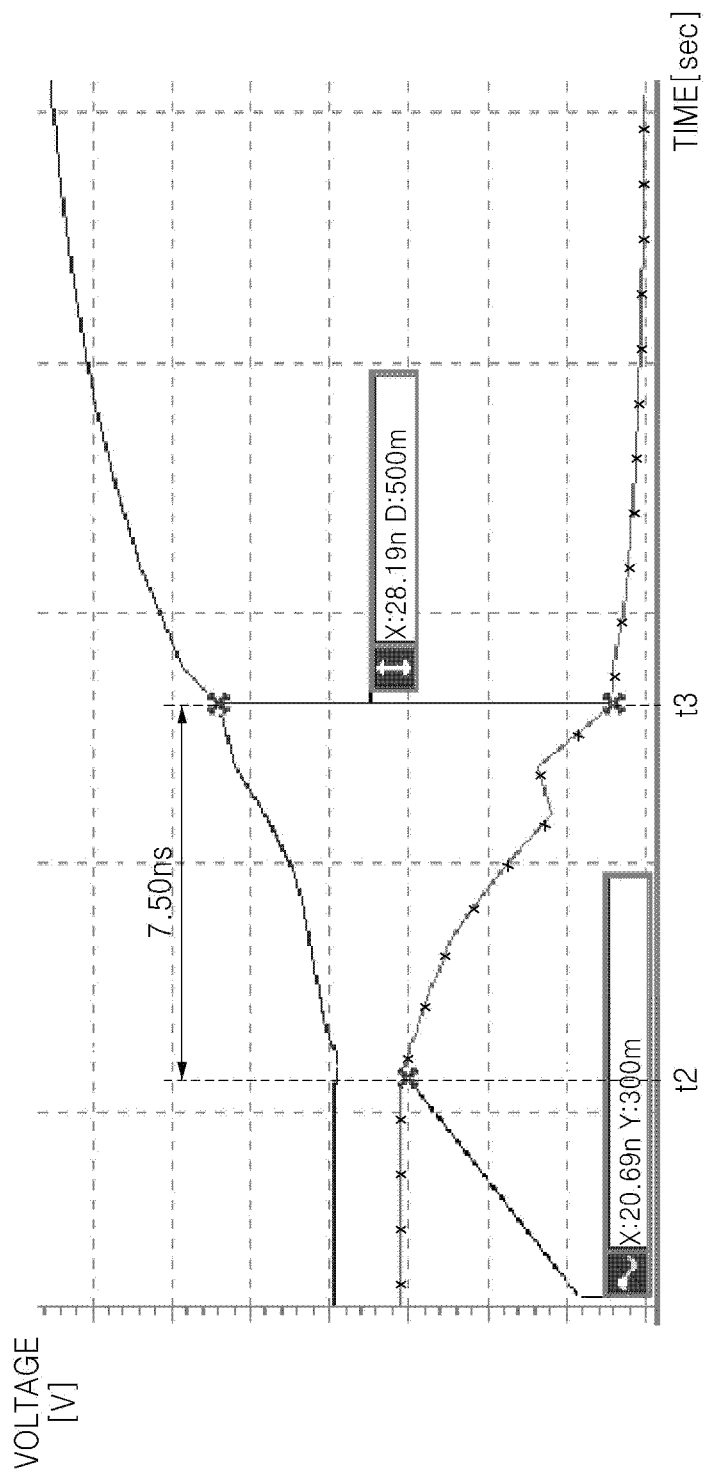
FIG. 9B is a graph showing the results of data sensing in a semiconductor memory device when a driving voltage is 0.8 V in a comparison example.

FIG. 9A is a graph showing the results of data sensing in a semiconductor memory device when a driving voltage is 0.8 V, according to some embodiments. FIG. 9B is a graph showing the results of data sensing in a semiconductor memory device when a driving voltage is 0.8 V in a comparison example.

Referring to FIG. 9A, it takes 5.08 nsec starting from when a voltage starts to be supplied to a sense amplifier until a voltage difference between a bit line and a complementary bit line reaches 500 mV. As such, it takes 5.08 nsec for data to be sensed. Referring to FIG. 9B, it takes 7.50 nsec for data to be sensed when conventional circuits are used. In other words, the semiconductor memory device according to certain disclosed embodiments has a faster data sensing speed than the conventional semiconductor memory device. In the embodiment shown in FIG. 9A, the speed is increased more than 45%.

It is seen from the FIGS. 7A through 9B that the data sensing speed of a semiconductor memory device according to some embodiments disclosed herein is more effectively improved as the driving voltage decreases.

As described above, according to some embodiments, a semiconductor memory device drives an N-type sense amplifier first with a voltage lower than a target source voltage or drives a P-type sense amplifier first with a voltage higher than a target source voltage, thereby increasing a data sensing margin and a data sensing speed without decreasing the threshold voltage of transistors.

While the present disclosure has been particularly shown and described with reference to exemplary embodiments thereof, it will be understood by those of ordinary skill in the art that various changes in forms and details may be made therein without departing from the spirit and scope of the present embodiments as defined by the following claims.

What is claimed is:

1. A semiconductor memory device comprising:
a sense amplifier comprising a pair of transistors cross-coupled between a bit line and a complementary bit line; and
a voltage supply circuit comprising at least two transistors, and configured to supply at least one source voltage having a level different than a target source voltage to a common source of the pair of transistors and then to supply the target source voltage to the common source during data sensing of the sense amplifier,
wherein that at least two transistors comprise a first transistor and a second transistor, and
wherein a first end of the first transistor is connected to the common source and the at least one source voltage is supplied to a second end of the first transistor, and a first end of the second transistor is connected to the common source and the target source voltage is supplied to a second end of the second transistor.

2. The semiconductor memory device of claim 1, wherein: the voltage supply circuit is configured to supply the at least one source voltage to the common source of the pair of transistors for a predetermined temporary period of time, and then subsequently to supply the target source voltage to the common source during data sensing of the sense amplifier.

3. The semiconductor memory device of claim 1, wherein the pair of transistors are a pair of N-type metal-oxide semiconductor (NMOS) transistors and the voltage supply circuit supplies at least one source voltage lower than the target source voltage to a common source of the pair of NMOS transistors and then supplies the target source voltage to the common source.

4. The semiconductor memory device of claim 3, wherein the voltage supply circuit comprises:
a voltage generation circuit configured to generate the target source voltage and the at least one source voltage.

5. The semiconductor memory device of claim 3, wherein the source voltage is between approximately −0.5 V and −0.2 V, and the target source voltage is approximately 0 V.

6. The semiconductor memory device of claim 1, wherein the pair of transistors are a pair of P-type metal-oxide semiconductor (PMOS) transistors and the voltage supply circuit supplies at least one source voltage higher than the target source voltage to a common source of the pair of PMOS transistors and then supplies the target source voltage to the common source.

7. The semiconductor memory device of claim 6, wherein the voltage supply circuit comprises:
a voltage generation circuit configured to generate the target source voltage and the at least one source voltage.

8. The semiconductor memory device of claim 6, wherein the target source voltage is between approximately 0.8 V and 1.2 V, and the source voltage is between approximately 0.2 V and 1 V higher than the target source voltage.

9. A method of a semiconductor memory device, the method comprising:
initiating supplying a first voltage to a sense amplifier at a first time;
initiating supplying a second voltage, having a different voltage level from the first voltage, to the sense amplifier at a second time;
discontinuing supplying the second voltage to the sense amplifier at a third time;
initiating supplying a third voltage, having a different voltage level from the second voltage, to the sense amplifier after the second time;
continuing supplying the third voltage to the sense amplifier after the third time; and
performing a data sensing operation on data by the sense amplifier for a period including the second time and the third time, using both the second voltage and the third voltage.

10. The method of claim 9, wherein the second voltage is higher than the third voltage.

11. The method of claim 10, wherein performing sensing based on the second voltage and third voltage increases a data sensing speed by at least 25% compared to data sensing based only on the third voltage.

12. The method of claim 9, wherein the second voltage is lower than the third voltage.

13. The method of claim 12, further comprising:
supplying a driving voltage to the sense amplifier between 0.8 V and 1 V, wherein performing sensing based on the second voltage and third voltage increases data sensing speed by at least 40% when a driving voltage of 0.8 V is used and by at least 25% when a driving voltage of 1 V is used, compared to data sensing based only on the third voltage.

14. The semiconductor memory device of claim 3, wherein the target source voltage is approximately 0 V.

15. The method of claim 10, wherein the first voltage is lower than the third voltage.

16. The method of claim 12, wherein the first voltage is higher than the third voltage.

17. A method of operating a semiconductor memory device, the method comprising:
initiating supplying a first voltage to a sense amplifier at a first time;
discontinuing supplying the first voltage to the sense amplifier at a second time;
initiating supplying a second voltage, having a lower voltage level than the first voltage, to the sense amplifier after the first time;
continuing supplying the second voltage to the sense amplifier after the second time; and
performing a data sensing operation on data by the sense amplifier for a period including the first time and the second time, using both the first voltage and the second voltage,
wherein performing sensing based on the first voltage and second voltage increases a data sensing speed by at least 25% compared to data sensing based only on the second voltage.

\* \* \* \* \*